United States Patent
Ogle, Jr. et al.

(10) Patent No.: US 6,709,927 B1
(45) Date of Patent: Mar. 23, 2004

(54) PROCESS FOR TREATING ONO DIELECTRIC FILM OF A FLOATING GATE MEMORY CELL

(75) Inventors: Robert Bertram Ogle, Jr., San Jose, CA (US); Arvind Halliyal, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/927,134

(22) Filed: Aug. 10, 2001

Related U.S. Application Data
(60) Provisional application No. 60/224,658, filed on Aug. 11, 2000.

(51) Int. Cl.[7] ................ H01L 21/336; H01L 21/3205; H01L 21/4763
(52) U.S. Cl. .................................... 438/261; 438/591
(58) Field of Search ................... 438/261, 591

(56) References Cited

U.S. PATENT DOCUMENTS

| | | | | |
|---|---|---|---|---|
| 5,836,772 A | * | 11/1998 | Chang et al. | 438/261 |
| 6,074,917 A | * | 6/2000 | Chang et al. | 438/261 |
| 6,306,777 B1 | * | 10/2001 | Ogle et al. | 438/763 |
| 6,319,775 B1 | * | 11/2001 | Halliyal et al. | 438/261 |
| 6,368,398 B2 | * | 4/2002 | Vaartstra | 106/287.18 |
| 6,376,341 B1 | * | 4/2002 | Kluth et al. | 438/510 |

OTHER PUBLICATIONS

Misra, V., et al., "Electrical Properties of Composite Gate Oxides Formed by Rapid Thermal Processing", Apr. 1996, IEEE Transactions on Electron Devices, Vol. 43, No. 4.*

* cited by examiner

Primary Examiner—Long Pham
Assistant Examiner—Howard Weiss
(74) Attorney, Agent, or Firm—Farjami & Farjami LLP

(57) ABSTRACT

A process to deposit a silicon dioxide layer on a silicon nitride layer for an ONO stack of a floating gate transistor. Silicon dioxide is deposited on a silicon nitride layer and annealed in a batch furnace or a single wafer rapid thermal anneal tool in a nitrogen oxide (NO) or nitrous oxide ($N_2O$) ambient environment.

18 Claims, 2 Drawing Sheets

PROCESS FOR TREATING ONO DIELECTRIC FILM OF A FLOATING GATE MEMORY CELL

CROSS REFERENCE

This application claims priority to provisional application No. 60/224,658 filed Aug. 11, 2000 entitled "Process for Treating ONO Dielectric Film of a Floating Gate Memory Cell". The inventors are Robert Bertran Ogle, Jr. and Arvind Halliyal.

CROSS-REFERENCE TO RELATED APPLICATIONS

The present invention is related to subject matter disclosed in the following co-pending patent applications:

1. United States patent application entitled, "Process for Treating ONO Dielectric Film of a Floating Gate Memory Cell", U.S. patent application Ser. No. 09/927,133 naming Robert B. Ogle, Jr. and Arvind Halliyal as inventors and filed on Aug. 10, 2001; and
2. United States patent application entitled, "Process for Treating ONO Dielectric Film of a Floating Gate Memory Cell", U.S. patent application Ser. No. 09/927,988 naming Robert B. Ogle, Jr. and Arvind Halliyal as inventors and filed on Aug. 10, 2001.

1. Field of Invention

The present invention relates to semiconductor processing. More specifically, it relates to processing an ONO dielectric film of a floating gate memory cell in a NO or $N_2O$ ambient environment.

2. Related Art

Non-volatile semiconductor memories, such as EEPROM (Electrically Erasable Programmable Read Only Memory) utilize stacked floating gate type field effect transistors. Conventionally, electrons are induced into a floating gate of a memory cell to be programmed by biasing a control gate at a certain voltage, and grounding the body region. The substrate is biased, while the control gate is grounded driving the electrons from the floating gate back into the substrate.

FIG. 1 is a cross sectional diagram of a floating gate memory cell 100. Memory cell 100 is a floating gate transistor having a control gate 102 coupled to a voltage line 122 for applying a voltage of $V_g$ on control gate 102. Control gate 102 is separated from a floating gate 106 by an upper insulating layer 104. The floating gate 106 is separated from a substrate 110 by a lower insulating layer 108.

Substrate 110 includes an n+ source region 112 coupled to a voltage line 132 for applying a voltage of $V_s$ on n+ source region 112, a p-doped body region 114 coupled to a voltage line 134 for applying a voltage on p-doped body region 114, and an n+ drain region 116 coupled to a voltage line 136 for applying a voltage of $V_D$ on n+ drain region 116.

Insulating layer 104 is a composite dielectric film surrounding floating gate 106 and insures that charge is retained in floating gate 106. One type of dielectric film used as an insulating layer consists of a stack of silicon dioxide-silicon nitride-silicon dioxide ("ONO") layers. The ONO stack 104 is used to isolate floating gate 106 and also couple high voltage from control gate 102 to floating gate 106. Electrical thickness of ONO stack 104 is in the range of 100 Å to 200 Å.

FIG. 2 is a cross-sectional diagram of ONO layer 104. Currently, silicon dioxide ($SiO_2$) layer 201 from 20 Å to 50 Å is formed by thermally oxidizing polysilicon floating gate 106, or by depositing a low pressure chemical vapor deposition (LPCVD) oxide (High Temperature Oxide (HTO)) or rapid thermal chemical vapor deposition (RTCVD) oxide.

Silicon nitride ($Si_3N_4$) layer 202 from 50 Å to 100 Å is formed on $SiO_2$ layer 201, by depositing LPCVD or RTCVD nitride.

A second layer of $SiO_2$ 203 from 20 Å to 60 Å is formed by steam oxidation of a part of $Si_3N_4$ layer 202. Conventionally, steam oxidation of the silicon nitride layer 202 is performed in a batch furnace at 900–1000 deg Celsius, preferably 950 deg Celsius.

Thermal oxidation of $Si_3N_4$ layer 202 is a slow process and the final thickness of the ONO layer is hard to scale for new generations of flash memory devices. A thermally deposited third layer of $SiO_2$ (HTO) may be used but the resulting ONO stack is too leaky and hence unreliable.

Accordingly, a process is desired to form the second $SiO_2$ layer that optimizes the characteristics of the ONO stack and maintains reliability of the ONO stack.

SUMMARY

The present invention is a method for forming an ONO stack of a floating gate transistor with a first layer of $SiO_2$ formed on the floating gate and a silicon nitride layer formed on the first $SiO_2$ layer. Thereafter, a second layer of silicon dioxide is thermally deposited on the silicon nitride layer, and the ONO stack is annealed in either a batch furnace or a single wafer rapid thermal annealing tool.

The annealing process in the batch furnace is performed at a temperature range of 800 to 1050 deg Celsius from 5 to 30 minutes with a gas mixture of 5% to 100% of either nitrogen oxide (NO) or nitrous oxide ($N_2O$) with argon, nitrogen and/or oxygen as carrier gases.

The annealing process in the single wafer rapid thermal annealing tool is performed at a temperature range of 700 to 1100 deg Celsius from 1 second to 120 seconds with a gas mixture of 1% to 100% NO or $N_2O$ with argon, nitrogen and/or oxygen as carrier gases.

The advantages of the present invention include reducing the processing time for forming the second $SiO_2$ layer, reducing the thickness of the second $SiO_2$ and minimizing change to the silicon nitride layer and hence improving overall reliability of the ONO stack.

The present invention will be more fully understood in light of the following detailed description taken together with the accompanying drawings.

DETAILED DESCRIPTION

Figure 1:
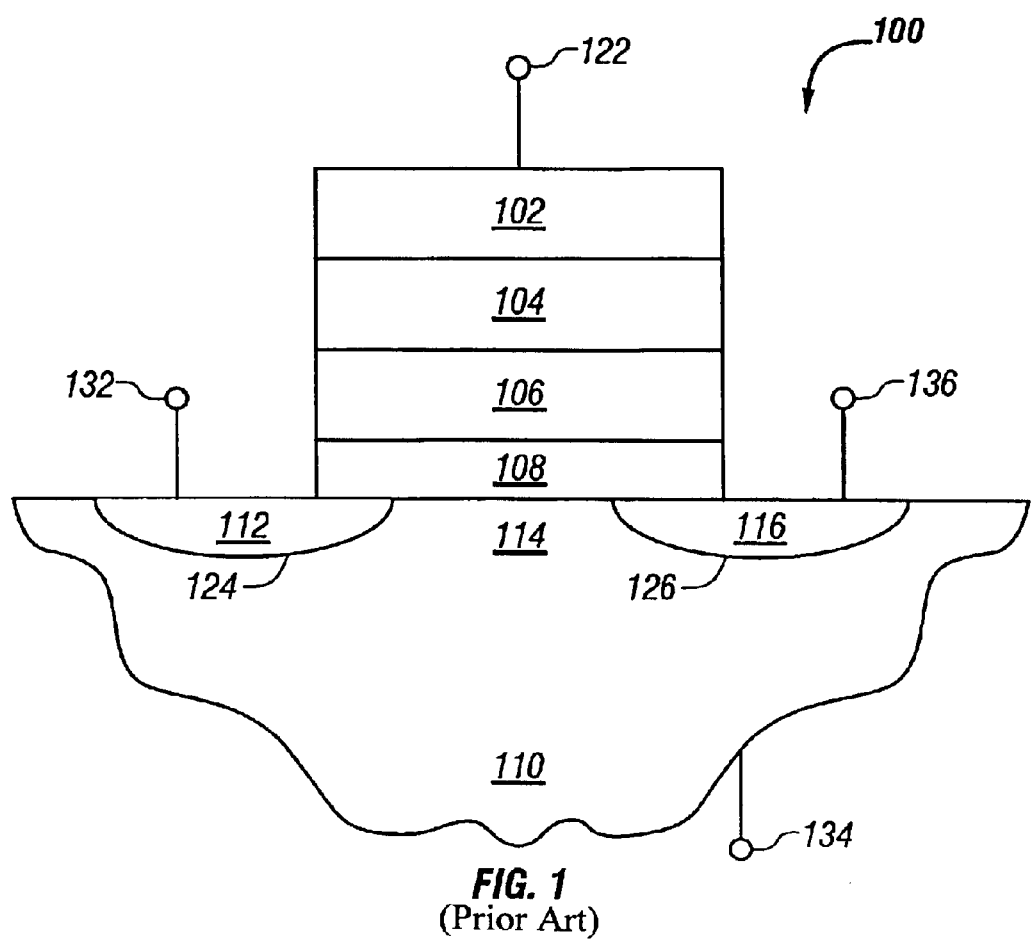
FIG. 1 is a cross sectional diagram of a floating gate memory cell.
Figure 2:
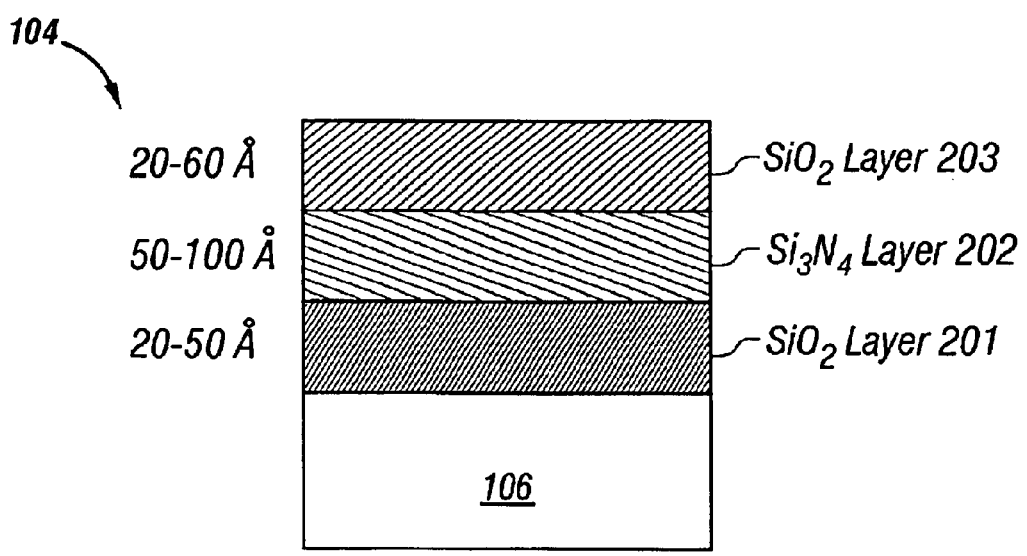
FIG. 2 is a cross sectional view of the ONO 104 of FIG. 1.
Figure 3:
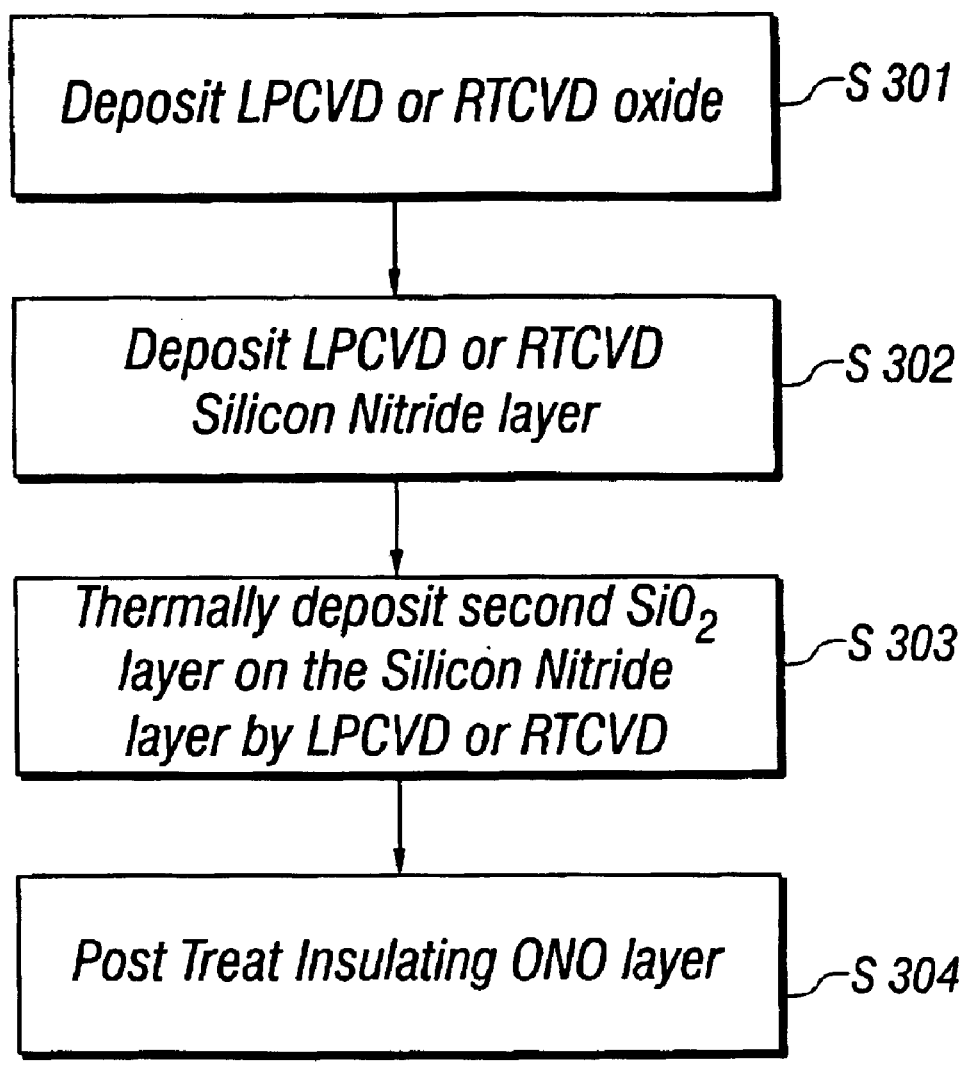
FIG. 3 is a process flow diagram of the present invention.

According to the present invention, a process is provided that efficiently deposits $SiO_2$ layer 203 on silicon nitride layer 202, post ONO stack 104, improves reliability of the dielectric layer 104 and optimizes $SiO_2$ layer 203. FIG. 3 is a process flow diagram of the method.

In step S301, a first $SiO_2$ layer 201 is formed on floating gate 106 either by LPCVD or RTCVD technique. In step S301, an oxide layer can be formed by an RTCVD technique in a single wafer tool at 700–750 degress Celsius, from a mixture of DCS and $N_2O$ or silane and $N_2O$ to form silicon nitride layer 202 on first $SiO_2$ layer 201. The oxide layer can also be formed by a LPCVD process in a batch furnace. In step S302, silicon nitride layer 202 can be formed by RTCVD for 50 to 100 seconds in a single wafer chamber at a constant pressure of 50 Torr and constant temperature of 700–750 deg Celsius, preferably 750 deg Celsius, from a mixture of dichlorosilane and ammonia or silane and ammonia. Silicon nitride layer 202 can also be formed by LPCVD process in a batch furnace.

In step S303, thermally deposit the second $SiO_2$ layer 203 by a single chamber RTCVD process. The process chamber is kept at a constant pressure of 50 Torr and constant temperature of 700–750 deg Celsius, preferably 750 deg Celsius. A mixture of dichlorosilane and $N_2O$ flows through the process chamber for 20 to 60 seconds at the foregoing constant process chamber temperature and pressure. $SiO_2$ layer 203 can also be deposited by LPCVD.

In step S304, post treat the ONO stack 104 by annealing in an NO or $N_2O$ ambient environment. Step S304 may be performed in either a batch furnace or single wafer RTA (Rapid Thermal Annealing) tool. The process parameters for both the batch furnace and single wafer RTA are provided in Table 1.

The process in the batch furnace is conducted at a temperature range of 800 to 1050 deg Celsius from 5 to 30 minutes, with a gas mix ranging from 5% to 100% of NO or $N_2O$, with argon, nitrogen and/or oxygen as carrier gases.

The process in the single wafer RTA tool is performed at a temperature range of 700 to 1100 deg Celsius from 1 second to 120 second with a gas mixture ranging from 1 to 100% of NO or $N_2O$ with argon, nitrogen and/or oxygen as carrier gases.

TABLE 1

| Annealing Parameters | Batch Furnace | Single Wafer |
| --- | --- | --- |
| Temperature Range | 800–1050 deg C. | 700–1100 deg C. |
| Processing Time | 300–1800 seconds | 1–120 seconds |
| Ambient Mixture | 5%–100% NO or $N_2O$ | 1%–100% NO or $N_2O$ |
| Carrier Gas | Ar, $N_2$ and/or $O_2$ | Ar, $N_2$ and/or $O_2$ |

The foregoing process is more efficient than partial thermal oxidation of the silicon nitride layer 202 to form the second layer of $SiO_2$ 203. Furthermore, the thickness of the silicon nitride layer 202 only changes by 10 Å to 20 Å, while the final $SiO_2$ layer 203 can be reduced below 25 Å–30 Å for ONO stacking and enhances the reliability and makes the process efficient.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as falling within the true spirit and scope of this invention.

We claim:

1. A method for forming an ONO stack of a floating gate transistor with a first layer of silicon dioxide formed on the floating gate and a layer of silicon nitride formed on the first silicon dioxide layer, comprising:

forming a second silicon dioxide layer by thermally depositing an oxide layer on the silicon nitride layer; and annealing the ONO stack after the second silicon dioxide layer has been formed;

wherein the annealing is performed in a batch furnace at a temperature range of 800 to 1150 deg Celsius for 300 seconds to 1800 seconds.

2. The method of claim 1, wherein the annealing is performed in the batch furnace with a gas mixture of 5% to 100% of NO, with argon as a carrier gas.

3. The method of claim 1, wherein the annealing is performed in the batch furnace with the gas mixture of 5% to 100% of NO with nitrogen as a carrier gas.

4. The method of claim 1, wherein the annealing is performed in the batch furnace with the gas mixture of 5% to 100% of NO with oxygen as a carrier gas.

5. The method of claim 1, wherein the annealing is performed in the batch furnace with the gas mixture of 5% to 100% of NO with argon, nitrogen and oxygen as carrier gases.

6. The method of claim 1, wherein the annealing is performed in the batch furnace with the gas mixture of 5% to 100% of $N_2O$ with nitrogen as a carrier gas.

7. The method of claim 1, wherein the annealing is performed in the batch furnace with the gas mixture of 5% to 100% of $N_2O$ with oxygen as a carrier gas.

8. The method of claim 1, wherein the annealing of the ONO stack is performed in the batch furnace with the gas mixture of 5% to 100% of $N_2O$ with argon as a carrier gas.

9. The method of claim 1, wherein the annealing of the ONO stack is performed in the batch furnace with the gas mixture of 5% to 100% of $N_2O$ with argon, nitrogen and oxygen as a carrier gas.

10. A method for forming an ONO stack of a floating gate transistor with a first layer of silicon dioxide formed on the floating gate and a layer of silicon nitride formed on the first silicon dioxide layer, comprising:

forming a second silicon dioxide layer by thermally depositing an oxide layer on the silicon nitride layer; and annealing the ONO stack after the second silicon dioxide layer has been formed;

wherein the annealing is performed in a single wafer Rapid Thermal Annealing tool at a temperature range of 700 to 1100 deg Celsius for one second to 120 seconds.

11. The method of claim 10, wherein the annealing is performed in a single wafer Rapid Thermal Annealing tool with a gas mixture of 1% to 100% of NO, with argon as a carrier gas.

12. The method of claim 10, wherein the annealing is performed in a single wafer Rapid Thermal Annealing tool with a gas mixture of 1% to 100% of NO, with nitrogen as a carrier gas.

13. The method of claim 10, wherein the annealing is performed in a single wafer Rapid Thermal Annealing tool with a gas mixture of 1% to 100% of NO, with oxygen as a carrier gas.

14. The method of claim 10, wherein the annealing is performed in a single wafer Rapid Thermal Annealing tool with a gas mixture of 1% to 100% of NO, with carrier gases argon, nitrogen and oxygen.

15. The method of claim 10, wherein the annealing is performed in a single wafer Rapid Thermal Annealing tool with a gas mixture of 1% to 100% of $N_2O$, with nitrogen as a carrier gas.

16. The method of claim 10, wherein the annealing is performed in a single wafer Rapid Thermal Annealing tool with a gas mixture of 1% to 100% of $N_2O$, with oxygen as a carrier gas.

17. The method of claim 10, wherein the annealing is performed in a single wafer Rapid Thermal Annealing tool with a gas mixture of 1% to 100% of $N_2O$, with argon as a carrier gas.

18. The method of claim 10, wherein the annealing is performed in a single wafer Rapid Thermal Annealing tool with a gas mixture of 1% to 100% of $N_2O$, with carrier gases argon, nitrogen and oxygen.

* * * * *